Feb. 27, 1968 M. W. MURRAY 3,371,228
TRANSISTOR ELECTRONIC SWITCH WITH BASE CONTROL STAGE
Filed June 26, 1963
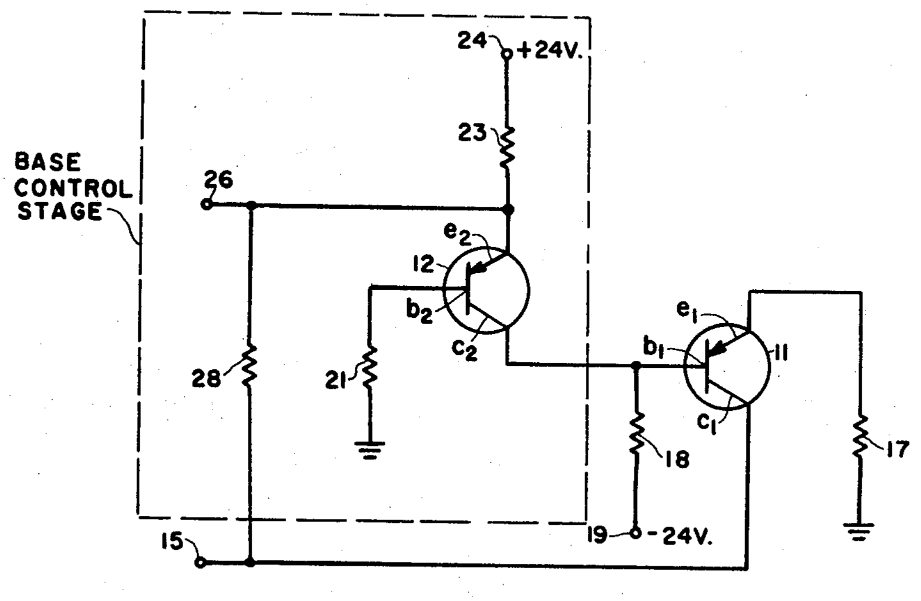
INVENTOR.
MAURICE W. MURRAY
BY
Irving Kayton
ATTORNEY United States Patent Office 3,371,228

Patented Feb. 27, 1968

3,371,228

TRANSISTOR ELECTRONIC SWITCH WITH BASE CONTROL STAGE

Maurice W. Murray, Scottsdale, Ariz., assignor to General Electric Corporation, a corporation of New York Filed June 26, 1963, Ser. No. 290,813

11 Claims. (Cl. 307—254)

This invention relates to a transistor electronic switch circuit, and more particularly, to an electronic switch which operates effectively with low input signal voltages.

In certain circuit applications, it is necessary to switch or gate one or more low level voltage signals into a utilization circuit. Such a system, for example, is a multichannel analog input to a digital-to-analog converter, whereby the original low level analog voltages are converted to digital signals subsequently operated upon by special or general purpose digital computation circuits. Typically in such applications, electronic gates or switches are required to gate the outputs of low signal level analog amplifiers into a single overall analog-to-digital converter unit. Since the individual signals applied from the amplifiers to the converter may represent voltages as small as ten millivolts input, the electronic gate used should approximate short circuit characteristics as closely as possible when in its conducting state to preclude swamping out the intelligence borne by the low level analog signals from the analog amplifier stages.

In a transistor type switch to which this invention is directed, this requires minimizing, or making as close to zero, the transistor collector-to-emitter voltage $(V_C - V_E)$ when there is a gated input signal to the switch. Minimizing this voltage offset of the switching transistor is the principal object of the invention.

The above object is accomplished in accordance with the principles of the invention by utilizing a saturated transistor stage as a gating element in combination with a base control circuit stage for the switching transistor. The base control stage functions to sample the input voltage signal and adjust, in accordance with the sample, the current required from the base of the switching transistor to minimize the switching transistor collector-to-emitter voltage drop. As will be demonstrated, this may be accomplished by constraining the ratio of collector-to-emitter current of the switching transistor to equal one.

In general outline, the circuit of the present invention in the embodiment later to be described in detail, comprises a first junction transistor acting as the switch transistor, and a second junction transistor acting as a base control transistor for the switch transistor. Each of the transistors has an emitter electrode, a collector electrode, and a base electrode, and each being either of the PNP or the NPN type. The collector electrode of the second transistor is connected to the base electrode of the switch transistor and through a resistor to a voltage source; the emitter of the base control transistor is connected to a second source. The base electrode of the base control transistor is connected through a resistor to a point of constant (ground) potential. The input signal is impressed upon the collector of the switch transistor (with the output being taken from the emitter of the switch transistor). The control signal is applied to the emitter of the base control transistor. The control input and signal input are tied together through an appropriate resistor. In this manner, the signal input is sampled to control the voltage on the emitter of the base control transistor, whereby the current through the base control transistor is effectively controlled. Due to this control, and by virtue of the fact that the collector of the base control transistor and the base of the switch transistor share a common resistance, the base current of the switch transistor is controlled to provide the minimum possible voltage offset.

The novel features believed to be characteristic of this invention are set forth with particularity in the appended claims. The invention itself, however, both as to its organization and method of operation, together with further objects and advantages thereof, may best be understood by reference to the following description taken in connection with the accompanying drawing which is a schematic diagram of a transistor electronic switch having a base control stage employing a transistor in accordance with the invention.

The drawing shows a two transistor switch where transistor 11 functions as the switch and transistor 12 functions as the base control for transistor 11. As shown, transistors 11 and 12 are junction transistors of the PNP type. Switch transistor 11 comprises an emitter electrode $e_1$, a collector electrode $c_1$ and a base electrode $b_1$. Base control transistor 12 comprises an emitter electrode $e_2$, a collector electrode $c_2$ and a base electrode $b_2$. Although PNP type transistors are shown, transistors of NPN type may also be utilized if proper polarity changes are made in the circuit.

Transistor 11 acts as the switch contact. Collector electrode $c_1$ is connected to an input terminal 15 and emitter electrode $e_1$ is connected through a load resistor 17 to ground. Base electrode $b_1$ is coupled through a resistor 18 to a negative supply terminal 19 having a potential of minus 24 volts. Base electrode $b_1$ is also connected to collector electrode $c_2$ of transistor 12.

Base electrode $b_2$ of transistor 12 is connected through a resistor 21 to ground. Emitter electrode $e_2$ is connected through a resistor 23 to a positive supply terminal 24 having a potential of plus 24 volts. Emitter electrode $e_2$ is also connected to an input control terminal 26. Connected between input terminals 15 and 26 which are the signal and control input terminals, respectively, is a resistor 28.

The switching circuit may have two different electrically stable conditions. In one condition, the electrical contact is closed; that is, the transistor 11 is conducting, in which case the differential impedance between collector electrode $c_1$ and emitter electrode $e_1$ is low. In the other condition, the electrical contact is open; that is, transistor 11 is non-conducting and the differential impedance between collector electrode $c_1$ and emitter electrode $e_1$ is quite high.

The presence of an electrical signal at the input control lead 26 of sufficient positive magnitude will raise the potential of base $b_1$ above the potential of both $e_1$ and $c_1$, thereby back-biasing both of these junctions and stopping conduction through the transistor 11. This condition effectively opens the transistor switch to passage of the input signal. The removal of the electrical signal from input control lead 26 allows transistor 12 to now establish a potential at $b_1$ of transistor 11 which is below the potential of both $e_1$ and $c_1$, thereby allowing junction current to flow and effectively closing the switch to passage of the input signal.

To insure that when the switch is closed the impedance is as low as possible, it will be now demonstrated that the circuit configuration of this drawing provides a voltage offset, i.e., voltage differential between the collector and emitter electrodes, that is a minimum. It can be demonstrated that the proper equation for the saturation voltage drop of a transistor is:

$$(V_C - V_E) = I_E(X r_C - r_E) + \frac{KT}{q} \ln \left( \frac{1 + X + X/B_N}{1 + X + 1/B_I} \right)$$

where:

$X = \frac{I_C}{I_E}$ = the ratio of collector current to emitter current $K$=Boltzmann's constant,
$T$=absolute temperature (degrees Kelvin),
$q$=absolute value of electron charge,
$r_E$=emitter resistance.
$r_C$=collector resistance,
$B_N$=Transistor Beta in the normal connection,
$B_I$=Transistor Beta in the inverted connection,
$V_C$=collector voltage,
$V_E$=emitter voltage, and
ln is the natural logarithm.

From the equation, it may be seen that by causing the ratio $X=I_C/I_E$ to be maintained at unity and causing $B_N$ and $B_I$ to be of sufficiently great magnitude, the logarithmic expression in the equation reduces to zero. This results in the minimum offset that can be realized, which is equal to $I_E(r_C-r_E)$.

This minimum offset voltage is achieved in the circuit by virtue of the operation of the base control transistor 12 relative to the switch transistor 11. Thus, it may be seen that in the operation of the switch, base control transistor 12, in addition to receiving the control input from terminal 26, also samples the signal input from terminal 15 by virtue of coupling resistor 28. Effectively, then, the voltage on emitter $e_2$ of base control transistor 12 is controlled such that the current through transistor 12 is appropriate to properly bias transistor 11 through its base $b_1$. This is so since not only is the collector $c_2$ current from transistor 12 used to bias transistor 11 through base $b_1$, but collector $c_2$ and base electrode $b_1$ of transistor 11 share common resistor 18. The manner in which these circuit relationships serve to insure that $I_C/I_E$ is maintained substantially at unity may be understood from the following considerations.

In transistor 11, the base current $I_B$ is equal to $I_E+I_C$. The value of $I_B$ in transistor 11 is set by resistor 18 minus the collector current of base control transistor 12. Since $I_E$ of switch transistor 11 is set by load resistor 17, it follows that maintaining $I_B$ of transistor 11 at twice the load current $I_E$, over the voltage range which the transistor switch is to operate, results in $I_C$ of transistor 11 being forced to equal $I_E$, thereby satisfying the required condition for $X=I_C/I_E=1$. For the circuit with the component values set forth below, the range of signal voltages to be switched is from zero to ten volts. Resistors 28 and 23 form a voltage divider which varies the emitter curent drive of base control transistor 12 as a function of the signal input voltage on terminal 15. Base control transistor 12 is used in a common base configuration and the collector current of this stage is equal to the emitter current multiplied by $\alpha$. As a general rule for a reasonable gain transistor, $\alpha$ is equal to or greater than .99. Therefore, the collector current is equal to the emitter current for transistor 12 with less than a one percent error. Effectively, therefore, resistors 28 and 23 sample the signal voltage to be switched and adjust the current flowing through base control transistor 12, such that the current flowing into resistor 18 from the base $b_1$ of transistor 11 is necessarily equal to twice the load current $I_E$. Therefore $I_C=I_E$, and $X=1$, which is the requirement under the requirement under the equation for minimizing the voltage offset.

In one particular successful reduction to practice, the following values for the parameters of the circuit were used:

| | Ohms |
|---|---|
| Resistor **17** | 10,000 |
| Resistor **18** | 3,900 |
| Resistor **21** | 5,100 |
| Resistor **23** | 4,590 |
| Resistor **28** | 1,970 |

While the principles of the invention have now been made clear in an illustrative embodiment, there will be immediately obvious to those skilled in the art many modifications in structure, arrangement, proportions, the elements, materials and components, used in the practice of the invention, and otherwise, which are particularly adapted for specific environments and operating requirements, without departing from those principles. The appended claims are therefore intended to cover and embrace any such modifications, within the limits only of the true spirit and scope of the invention.

What is claimed as new and desired to be secured by Letters Patent of the United States is:

1. A transistor switching circuit for opening and closing an electrical line and which functions substantially as a short circuit in its closed state, comprising: a first junction transistor having emitter, collector and base electrodes; means for connecting said emitter and collector electrodes in series with said line; means for applying an input signal to said collector electrode; and base control means continuously responsive to said input signal and coupled to said base electrode for continuously controlling the base current of said transistor in accordance with the magnitude of said input signal to render the collector and emitter currents of said transistor substantially equal.

2. A transistor switching circuit as recited in claim 1 wherein said base control means comprises a second junction transistor having its collector electrode coupled to said base electrode of said first transistor and including signal transfer means for applying said input signal to the emitter electrode of said second transistor.

3. A transistor switching circuit as recited in claim 2 wherein said signal transfer means comprises a resistor connecting the emitter electrode of said second transistor to said collector electrode of said first transistor.

4. A transistor switching circuit as recited in claim 2 wherein said base electrode of said first transistor is also connected through a resistor to a source of potential.

5. A transistor switching circuit for opening and closing an electrical line, comprising: first and second junction transistors, each of said transistors having an emitter electrode, a collector electrode, and a base electrode; means for applying input signals to the collector electrode of said first transistor; means for applying control signals to the emitter electrode of said second transistor; a resistor connected between said emitter electrode of said second transistor and said collector electrode of said first transistor; and means for controlling the base current of said first transistor including means connecting said collector electrode of said second transistor to said base electrode of said first transistor and a resistor connecting said base electrode of said first transistor to a voltage source.

6. A transistor switching circuit for applying an input signal provided by a signal source to a load comprising: a semiconductor device having first, second and third electrodes, means for connecting the first and second electrodes of said semiconductor device in series between the signal source and the load whereby the input signal is applied to the load through said semiconductor device, and control means connected to the third electrode of said semiconductor device and responsive to the input signal provided by the signal source for causing the current flowing in the first electrode of said semiconductor device to be substantially equal to the current flowing in the second electrode and for causing the current in the third electrode of said semiconductor device to be approximately twice that flowing in the second electrode.

7. The circuit of claim 6 in which said control means includes means for selectively inhibiting current flow in said semiconductor device.

8. A transistor switching circuit for applying an input signal provided by a signal source to a load comprising: a semiconductor device having first, second and third electrodes, means for connecting the first and second electrodes of said semiconductor device in series between the signal source and the load whereby the input signal is applied to the load through said semiconductor device, means connected to said semiconductor device for forward biasing the first and second electrodes of said semiconductor device relative to the third electrode of said semiconductor device, and control means connected to the third electrode of said semiconductor device and responsive to the input signal provided by the signal source for causing the current flowing in the third electrode to be substantially twice that flowing in the first electrode whereby the current flowing in the second electrode is constrained to be substantially equal to the current flowing in the first electrode and the voltage between the first and second electrodes of said semiconductor device is minimized.

9. A semiconductor switching circuit for applying an input signal provided by a signal source to a load comprising: a first semiconductor device having first, second and third electrodes, means for connecting the first and second electrodes of said first semiconductor device in series between the signal source and the load whereby the input signal is applied to the load through said first semiconductor device, a second semiconductor device having first, second and third electrodes, means for connecting the first electrode of said second semiconductor device to the third electrode of said first semiconductor device and for connecting both of said electrodes to a point of predetermined potential, means for connecting the second electrode of said second semiconductor device to a point of predetermined potential, and means for applying the input signal provided by the signal source to the third electrode of said second semiconductor device to cause said second semiconductor device to be continuously responsive to the input signal whereby a current which is substantially equal to twice the current in the load is caused to flow in the third electrode of said first semiconductor device, minimizing the potential between the first and second electrodes of said first semiconductor device.

10. A transistor switching circuit for applying an input signal provided by a signal source to a load comprising: a first semiconductor device having emitter, collector and base electrodes, means for connecting the emitter and collector electrodes of said first semiconductor device in series between the signal source and the load whereby the input signal is applied to the load through said first semiconductor device, a second semiconductor device having emitter, collector and base electrodes, means for connecting the base electrode of said second semiconductor device to a predetermined potential, means for connecting the collector electrode of said second semiconductor device to the base electrode of said first semiconductor device, means for connecting the base electrode of said first semiconductor device to a source of predetermined potential, voltage dividing means connected between the collector electrode of said first semiconductor device and a source of predetermined potential, means for connecting an intermediate point of said voltage dividing means to the emitter electrode of said second semiconductor device for controlling the current in the collector electrode of said second semiconductor device to cause the current in the base electrode of said first semiconductor device to be substantially twice the current in the emitter electrode of said first semiconductor device, whereby the potential between the collector and emitter electrodes of said first semiconductor device is minimized, and means connected to said second semiconductor device for selectively inhibiting current flow in said first semiconductor device.

11. A transistor switching circuit for applying an input signal provided by a signal source to a load comprising: a first semiconductor device having emitter, collector and base electrodes, means for connecting the emitter and collector electrodes of said first semiconductor device in series between the signal source and the load whereby the input signal is applied to the load through said first semiconductor device, means connected to the base electrode of said first semiconductor device and adapted to be connected to a source of predetermined potential for forward biasing the collector and emitter electrodes of first said semiconductor device relative to the base electrode of said first semiconductor device, a second semiconductor device having first, second and third electrodes, means connecting the first electrode of said second semiconductor device to the base electrode of said first semiconductor device, means connected to the second electrode of said second semiconductor device and adapted to be connected to a point of predetermined potential, and means adapted to respond to the input signal and connected to the third electrode of said second semiconductor device for causing said second semiconductor device to constrain the current in the collector electrode of said first semiconductor device to be substantially equal to the current in the emitter electrode of said first semiconductor device.

References Cited

UNITED STATES PATENTS

| | | | |
|---|---|---|---|
| 2,823,322 | 2/1958 | Trousdale | 307—88.5 |
| 2,829,281 | 4/1958 | Van Overbeek | 307—88.5 |

JOHN S. HEYMAN, *Primary Examiner.*

ARTHUR GAUSS, *Examiner.*

R. H. EPSTEIN, I. C. EDELL, *Assistant Examiners.*